US006812739B2

(12) United States Patent
Carballo et al.

(10) Patent No.: US 6,812,739 B2
(45) Date of Patent: Nov. 2, 2004

(54) METHOD OF TRANSPARENTLY REDUCING POWER CONSUMPTION OF A HIGH-SPEED COMMUNICATION LINK

(75) Inventors: Juan-Antonio Carballo, Austin, TX (US); Jeffrey L. Burns, Austin, TX (US); Gary Dale Carpenter, Austin, TX (US); Kevin John Nowka, Round Rock, TX (US); Ivan Vo, Austin, TX (US); Seung-moon Yoo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 10/255,471

(22) Filed: Sep. 26, 2002

(65) Prior Publication Data

US 2004/0061523 A1 Apr. 1, 2004

(51) Int. Cl.[7] .......................................... H03K 19/0175
(52) U.S. Cl. ............................ 326/80; 326/63; 327/333
(58) Field of Search ............................. 326/62, 63, 80; 327/333

(56) References Cited

U.S. PATENT DOCUMENTS

| 5,561,388 A | * | 10/1996 | Kumagai ...................... 326/66 |
| 5,712,586 A | * | 1/1998 | Kitao ........................ 327/333 |
| 6,025,737 A | * | 2/2000 | Patel et al. .................... 326/80 |
| 6,107,946 A | | 8/2000 | Jeong ......................... 341/101 |
| 6,122,336 A | | 9/2000 | Anderson .................... 375/371 |

OTHER PUBLICATIONS

Wei–Hung Chen, Guang–Kaai Dehng, Jong–Woei Chen and Shen–Iuan Liu, *A CMOS 400–MB/s Serial Link for AS–Memory System Using a PWM Scheme*, IEEE Journal of Solid State Circuits, vol. 36, Issue 10, Oct. 2001 pp. 1498–1505.

Chih–Kong Ken Yang, Ramin Farjad–Rad and Mark A, Horowitz, *A 0.5–µm CMOS 4.0–Gbit/s Serial Link Transceiver With Data Recovery Using Oversampling*, IEEE Journal of Solid State Circuits, vol. 33, Issue 5, May 1998, pp. 713–722.

John M. Khoury and Kadaba R. Lakshmikumar, *High–Speed Srial Transceivers for Data Communication Systems*, IEEE Communications Magazine, vol. 39, Issue 7, Jul. 2001, pp. 160–165.

* cited by examiner

*Primary Examiner*—Daniel Chang
(74) *Attorney, Agent, or Firm*—Volel Emile; Casimer K. Salys

(57) ABSTRACT

A method of reducing power consumption while maintaining performance characteristics and avoiding costly overdesign of a high-speed communication link embedded in an SOC is provided. The method includes synthesizing the communication link at a reduced voltage to determine and isolate circuitry that is supply-voltage-critical from circuitry that is non-supply-voltage-critical. The supply-voltage-critical circuitry contains components that may not operate at the reduced voltage without degrading the performance characteristics of the communication link. A non-reduced voltage is used to drive the supply-voltage-critical circuitry while the reduced voltage is used to drive the non-supply-voltage-critical circuitry. The reduced voltage is generated using a voltage regulator embedded in the communication link.

14 Claims, 4 Drawing Sheets

METHOD OF TRANSPARENTLY REDUCING POWER CONSUMPTION OF A HIGH-SPEED COMMUNICATION LINK

BACKGROUND OF THE INVENTION

1. Technical Field

The present invention is directed generally to integrated circuit technology. More specifically, the present invention is directed to a method of transparently reducing power consumed by a high-speed communication link.

2. Description of Related Art

With the advent of fast processors, data-intensive applications (e.g., multimedia, graphics) and network architectures such as wide area networks etc., there has been an increasing demand for high data bandwidth in the computer industry. One method that has been used to meet that demand is to transfer data in parallel to obtain a higher aggregate bandwidth. Basically, the data is broken down into packets and the packets are routed to a multiplicity of communication link transmitters. The transmitters then transfer the packets of data to corresponding communication link receivers. Once received, the data is serialized and processed.

Due to the recent emergence of systems-on-a-chip (SOC) products, it is inevitable that the communication links would be embedded in chips. In an SOC, all the electronics of a computer system, for example, or large portions of packet switch systems are integrated onto a single chip. Generally, the SOCs are implemented using complementary metal oxide semiconductor (CMOS) technology. CMOS transistors are constantly decreasing in size, leading to ever-faster transistors and higher degrees of integration. Indeed, some 0.1 micron CMOS circuits may contain thousands of transistors and operate in the GHz range. In addition, CMOS circuits can operate at very low voltages. Hence, CMOS technology is ideal for implementing these communication links on a chip. Note that the communication links will henceforth be referred to as high-speed communication links to stress the fact that they operate in the GHz range.

As is well known in the art, the more digital logic that is integrated in a chip, the more power the chip consumes. And, since only a limited amount of heat generated by a chip can be dissipated through the chip package, the chip has to be designed such that its performance is maximized while its power consumption is minimized.

Consequently, what is needed is a method of reducing communication link power consumption and thus the power consumption of the SOC within which the link is embedded. In doing so, however, the link's performance characteristics should be maintained while costly over-design of the link is avoided.

SUMMARY OF THE INVENTION

The present invention provides a method of reducing power consumption while maintaining performance characteristics and avoiding costly over-design of a high-speed communication link embedded in an SOC. The method includes synthesizing the communication link at a reduced voltage to determine and isolate circuitry that is supply-voltage-critical from circuitry that is non-supply-voltage-critical. The supply-voltage-critical circuitry contains components that may not operate at the reduced voltage without degrading the performance characteristics of the communication link. A non-reduced voltage is used to drive the supply-voltage-critical circuitry while the reduced voltage is used to drive the non-supply-voltage-critical circuitry. The reduced voltage is generated using a voltage regulator embedded in the communication link.

In one embodiment, the two circuitries interface each other at a boundary that is selected to yield the minimal amount of interfacing points. This optimizes the communication link since a level shifter has to be used at each interfacing point to change the voltage level of migrating signals.

Further, the SOC may contain hundreds of high-speed communication links. Each communication link has an embedded voltage regulator. Consequently, the area of the SOC used by the regulators may be substantial. To minimize this area, a plurality of the high-speed communication links may be designed to share a common voltage regulator.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
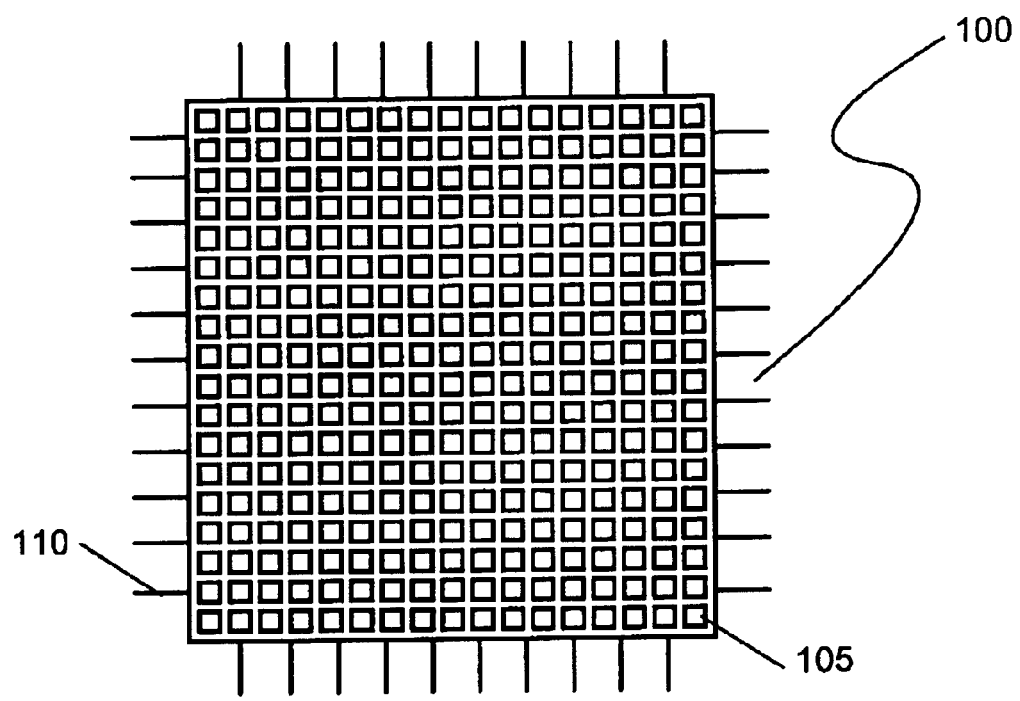
FIG. 1 is a perspective view of an SOC.
Figure 2:
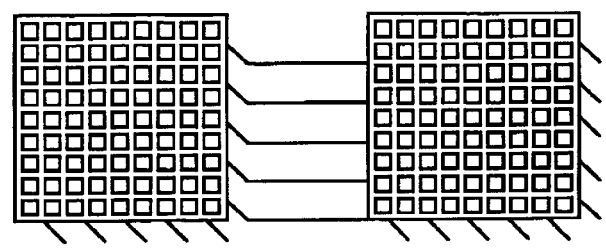
FIG. 2 depicts two SOCs being connected to each other.

Turning to the figures, FIG. 1 is a perspective view of an SOC 100. The SOC 100 may include hundreds of low-power integrated high-speed communication links 105 and a multiplicity of input/output (I/O) pins 110. The high-speed communication links 105 are generally implemented as CMOS circuits using ASIC (application specific integrated circuit) and/or FPGA (field programmable gate array) technology. The high-speed communication links 105 may be interconnected through metal traces embedded in the chip and/or they may be connected to other ASICs and/or FPGAs on other chips or SOCs as shown in FIG. 2.

The high-speed communication links 105 may be serial link receivers and/or serial link transmitters. The invention will be disclosed using a serial link receiver. However, it should be obvious to one skilled in the art that the disclosure is equally applicable to serial link transmitters.

Figure 3:
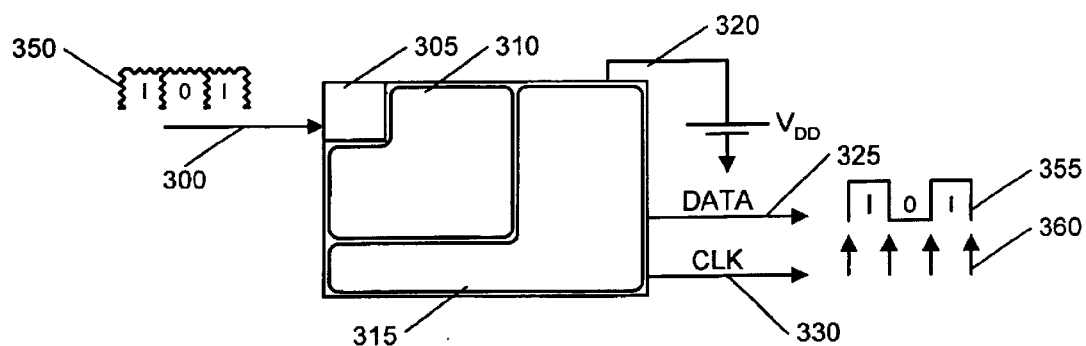
FIG. 3 depicts a low-power serial link receiver.

FIG. 3 depicts a low-power high-speed serial link receiver (or clock-and-data recovery link). These links generally contain analog circuitry. However, due to signal processing complexities brought by stringent bit-error-rate requirements, an increasingly large portion of the links is becoming digital. Hence in the figure, both analog and digital circuitries are shown. For example, circuitry 305 is analog and circuitries 310 and 315 are digital.

Digital circuitries 310 and 315 are separated from each other because they operate at different voltage levels. Circuitry 310 operates at $V_{DD}$, the voltage supplied to the SOC and circuitry 315 operates at $V_{DDL}$, a voltage lower than $V_{DD}$. The lower voltage is used to minimize the communication link's power consumption since power consumption equates largely to heat generation, a primary enemy of performance. Thus, minimizing the link's power consumption may allow more high-speed communication links to be embedded in the SOC, which may then yield a greater aggregate bandwidth.

As will be shown later, to supply the lower voltage to circuitry 315, an embedded voltage regulator is used to down-convert $V_{DD}$ to $V_{DDL}$. A key benefit of using the voltage regulator is that in addition to reducing the voltage $V_{DD}$, the regulator also reduces voltage variations or fluctuations. Particularly, a standard voltage supply may have a voltage fluctuation window of 1.1 v–1.3 v (a 15% variation) whereas a regulator may have a window of 0.94 v–0.96 v (less than 3% variation). Wide voltage fluctuations make it more difficult to reduce power, because the logic may have to be over-designed (i.e., certain components may have to be over-sized and/or buffers may have to be added) in order to satisfy both the high and low fluctuation points.

To determine which part of the digital circuitry is to be supplied $V_{DD}$ and which part will be supplied $V_{DDL}$, the circuit is re-synthesized using the $V_{DDL}$ voltage level. To re-synthesize a digital circuit is to re-arrange the logical gates of the circuit to satisfy a set of logic equations while certain timing constraints are maintained. During the re-synthesizing process, some components may be resized and/or customized. All components that become a data bottleneck at the $V_{DDL}$ voltage level despite re-synthesis and resizing may be labeled performance-critical or supply-voltage-critical components. All performance-critical components are supplied the original voltage (i.e., $V_{DD}$). Circuitry 310 contains all the performance-critical components and circuitry 315 contains the remainder of the digital circuit.

At each of the points where the circuitry 310 interfaces with the circuitry 315, a level shifter is used. A level shifter changes the voltage of a signal to a different voltage. For example, suppose $V_{DD}$ is 1.2 v and $V_{DDL}$ is 0.9 v. Suppose further, that a 1.2 v signal and a 0.9 v signal are each a logical one (1). When a logical one (1) signal migrates from circuitry 310 (i.e., the $V_{DD}$-supplied circuitry) to circuitry 315 (the $V_{DDL}$-supplied circuitry), its voltage has to be changed from 1.2 v to 0.9 v. Conversely, when the logical one (1) signal migrates from the circuitry 315 to the circuitry 310, its voltage has to be changed from 0.9 v to 1.2 v. Thus, level shifters ensure that correct voltages are used to properly represent signals. Note that for small voltage differences, only low-to-high level shifters need be implemented as circuits.

In any event, since a level shifter has to be used at each interface point between the two voltage circuitries, the position of the border between the standard-voltage circuitry and the low-voltage circuitry should be optimized. That is, the number of interface points between the two voltage regions should be minimized. This, in turn, minimizes any overhead (power and SOC's real estate) that may be due to the level shifters.

Returning to FIG. 3, $V_{DD}$ is supplied to the high-speed receiver link via connector 320 and data 350 enters the receiver through input connector 300. As shown, the signal representing data 350 has some jitter and implicitly contains clock information 360. The data 350 may travel back and forth between logic circuit 310 and logic circuit 315 while being processed. After processing, the signal emerges as digital data 355 out of output connector 325 and clock information 360 is exited out of output connector 330.

Figure 4:
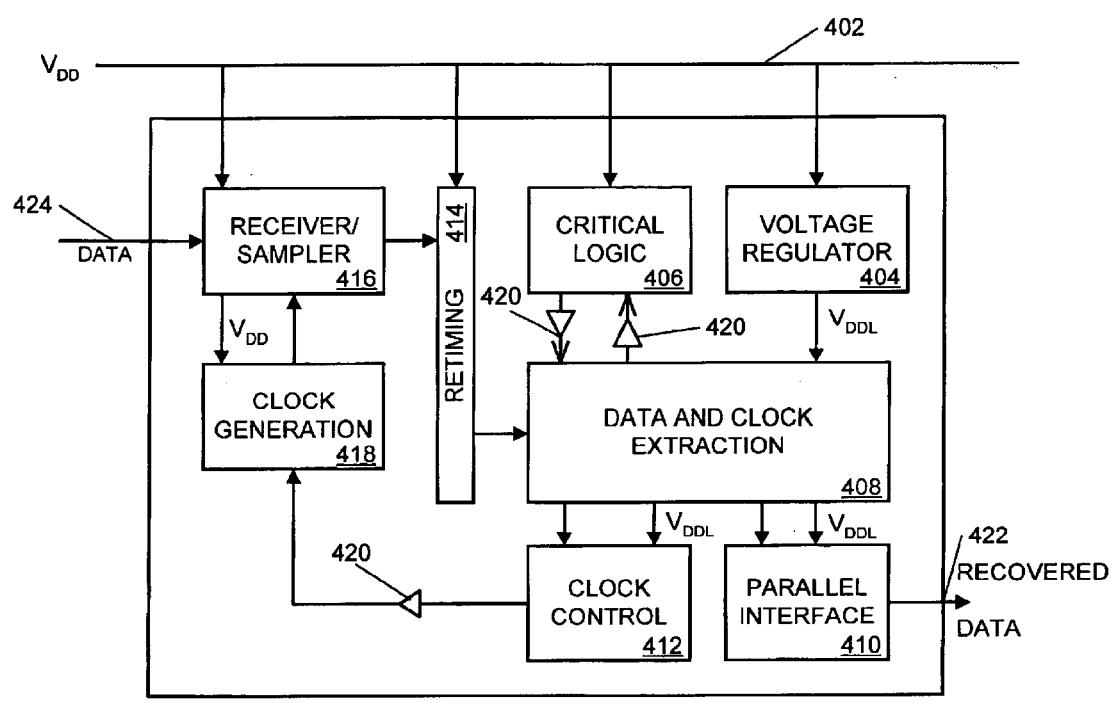
FIG. 4 is a detailed representation of the receiver core of FIG. 3.

FIG. 4 is a detailed representation of the receiver core of FIG. 3. In FIG. 4, an embedded linear voltage regulator 404 is shown. It is well known in the art to embed linear voltage regulators, which themselves are electronic devices, in a chip; and consequently, the method of integrating a voltage regulator in a high-speed link receiver will not herein be described.

The voltage regulator 404, performance-critical logic components or circuit 406, retiming circuit 414, receiver/sampler circuit 416 and clock generation circuit 418 all receive a $V_{DD}$ voltage level. The $V_{DD}$ voltage level is fed to the high-speed receiver link via connector 402. As mentioned above, the voltage regulator 404 reduces the $V_{DD}$ voltage level to a $V_{DDL}$ voltage level. The $V_{DDL}$ voltage level is used to drive data and clock extraction circuit 408, clock control circuit 412 and parallel interface 410.

Data enters the high-speed link receiver via connector 424 connected to receiver/sampler 416. The data generally comes into the link as an analog signal and is digitized by the receiver/sampler 416. From the receiver/sampler 416, the data travels to a retiming circuit 414 that synchronizes the sampled bits. From the retiming circuit 414 the data goes to data and block extraction 408.

As previously mentioned, the data may move back and forth between performance-critical circuit 406 and data and clock extraction 408 through level shifters 420. When the data is recovered, it may exit the high-speed link receiver from parallel interface 410 via connector 422. The clock information extracted by data and clock extraction 408 is sent to clock generation circuit 418 from clock control circuit 412. There too, a level shifter 420 is used.

Obviously, each embedded voltage regulator 404 will use an area of the SOC's real estate. This area may be substantial as there may be hundreds of these high-speed links (receivers and transmitters) on the chip. Thus, to minimize the area used by the regulators, one voltage regulator 404 may be shared by a plurality of the high-speed links. For example, a voltage regulator has an output section and a core section. The core section typically includes a voltage reference section. The voltage reference section does not vary significantly with load. Thus, to have more than one high-speed link share a voltage regulator, only the output of the regulator needs be varied.

Figure 5:
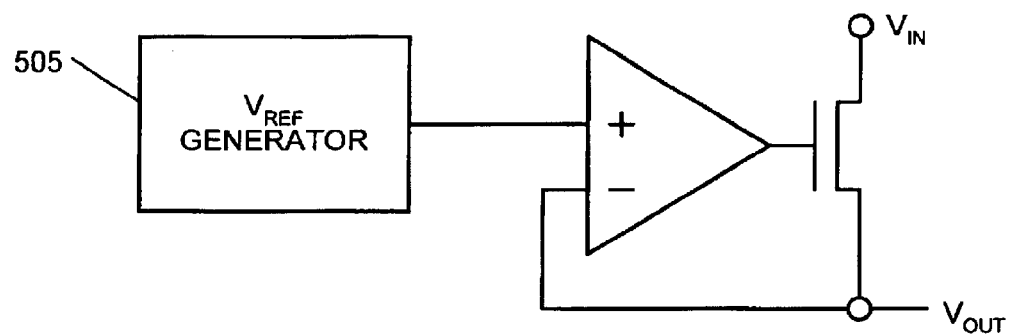
FIG. 5 depicts an exemplary CMOS voltage regulator.

FIG. 5 depicts an exemplary CMOS voltage regulator. Section 505 of the regulator is the voltage reference section and does not vary significantly with the load on the regulator. Thus, the more links that share a voltage reference, the greater the area saved.

The present invention was evaluated on a 0.12 micron, 3.125 Gigabit/sec CMOS communication link receiver by means of a simulation study. For a 4-link core, applying the invention yielded the results shown in the table below.

| High (original) Voltage level | 1.2 v |
|---|---|
| Low Voltage Level | 0.9 v |
| Voltage Regulator Type | Linear |
| Digital Power Consumption | 30% reduction (including regulator losses) |
| Performance | No Penalty |
| Area | 2% Penalty |

Thus, the invention has the following advantages: (1) significant reduction of power consumption, (2) ability to recover performance lost due to supply voltage reduction, (3) transparency of low-voltage scheme to the SOC where the link is embedded, (4) no impact on the number of I/O pins in the SOC, (5) low impact of power distribution in the SOC, (6) reduced area impact of power reduction when scaled to multiple links, and (7) ability to meet wide voltage supply variation requirements without over-designing the logic thus saving more power.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An integrated circuit communication link comprising:
   a first logic circuit group characterized by supply voltage magnitude critical circuitry and being driven by a first voltage of a first magnitude and a first range of variations;
   a second logic circuit group characterized by supply voltage variations critical circuitry and being driven by a second voltage of second magnitude and a second range of variations, the first voltage magnitude being higher than the second voltage magnitude;
   an embedded voltage regulator for supplying the second voltage with the second range of variations materially less than the first range of variations; and
   at least one level shifter for interfacing the first logic circuit group with the second logic circuit group.

2. The communication link of claim 1 wherein the first voltage is supplied to the communication link.

3. The communication link of claim 2 wherein the first voltage is used to generate the second voltage.

4. The communication link of claim 3 wherein the first logic circuit group interfaces with the second logic circuit group at a plurality of points, the plurality of points being a minimal number of points.

5. The communication link of claim 4 wherein a level shifter is used at each interfacing point.

6. The communication link of claim 5 wherein the communication link is on a chip, the chip having a multiplicity of communication links, a plurality of the multiplicity of the communication links sharing the embedded voltage regulator.

7. A chip comprising:
   a plurality of embedded communication links, the links including each:
   a first logic circuit group characterized by a supply voltage magnitude critical circuitry and being driven by a first voltage of a first magnitude and a first range of variations;
   a second logic circuit group characterized by supply voltage variation critical circuitry and being driven by a second voltage of a second magnitude and a second range of variations, the first voltage magnitude being higher than the second voltage magnitude;
   an embedded voltage regulator for supplying the second voltage with the second range of variations materially less than the first range of variations; and
   at least one level shifter for interfacing the first logic circuit group with the second logic circuit group.

8. The chip of claim 7 wherein the first voltage is supplied to the communication link.

9. The chip of claim 8 wherein the first logic circuit group interfaces with the second logic circuit group at a plurality of points, the plurality of points being a minimal number of points.

10. The chip of claim 9 wherein a level shifter is used at each interfacing point.

11. The chip of claim 10 wherein a plurality of the communication links share the embedded voltage regulator.

12. A chip comprising:
    a plurality of embedded communication links, the links including each:
    a first logic circuit group characterized by a supply voltage critical circuitry and being driven by a first voltage;
    a second logic circuit group being driven by a second voltage, the first voltage being higher than the second voltage;
    an embedded voltage regulator for supplying the second voltage, the embedded voltage regulator being shared by a plurality of links; and
    at least one level shifter for selectively interfacing the first logic circuit group with the second logic circuit group.

13. The chip of claim 12 wherein the voltage regulator includes a voltage reference generator and an output section, the voltage reference generator being shared by the plurality of links.

14. The chip of claim 12 wherein the voltage regulator is used for minimizing voltage fluctuations in the second voltage.

* * * * *